United States Patent [19]
Janssen

[11] 4,179,636
[45] Dec. 18, 1979

[54] ELECTRIC INCANDESCENT LAMP

[75] Inventor: Eduard J. P. Janssen, Eindhoven, Netherlands

[73] Assignee: U.S. Philips Corporation, New York, N.Y.

[21] Appl. No.: 884,375

[22] Filed: Mar. 7, 1978

[30] Foreign Application Priority Data

May 2, 1977 [NL] Netherlands .................. 7704774

[51] Int. Cl.² .................. H01J 1/96; H01J 19/50; H01K 1/18
[52] U.S. Cl. .................. 313/274; 313/371; 313/379
[58] Field of Search .................. 313/274, 279, 271, 272, 313/273

[56] References Cited
U.S. PATENT DOCUMENTS

| 3,194,999 | 7/1965 | Heinlein | 313/279 X |
| 3,392,299 | 7/1968 | Kern | 313/274 X |
| 3,736,455 | 5/1973 | Notelteirs et al. | 313/274 |
| 3,760,217 | 9/1973 | Martin et al. | 313/279 |
| 3,784,865 | 1/1974 | Shanks | 313/274 |
| 3,982,145 | 9/1976 | Liptou | 313/279 |

Primary Examiner—Saxfield Chatmon, Jr.
Attorney, Agent, or Firm—Robert S. Smith

[57] ABSTRACT

In tubular incandescent lamps having an axially arranged double-coiled filament on each support is present on a single-coiled part between two double-coiled parts of the filament. The single-coiled parts and the double-coiled parts have the same inside diameter, which enables a simple method of production, and hence have a different outside diameter. As a result of this a support provided on a single-coiled part cannot move onto a double coiled part. The construction results in lamps which have a usual operating life span which is closer to a desirable norm.

4 Claims, 6 Drawing Figures

ELECTRIC INCANDESCENT LAMP

The invention relates to an electric lamp having a tubular lamp envelope in which a filament of helically wound wire is arranged axially between current supply conductors which pass through the wall of the lamp envelope in a vacuum-tight manner, which filament is supported between its ends by at least one wire support having a spiral part which at one end is in contact with the wall of the lamp envelope and which at the other end comprises a helically wound part which is in contact with the filament.

Such a lamp is known from U.S. Pat. No. 3,168,670. In this known lamp the filament consists throughout its length of single coiled wire. In order to prevent the support provided between the ends of the filament from moving, some turns of the helically wound part of the support are arranged between the turns of the filament and the remaining turns are wound with opposite helical sense back around the turns of the filament and the said some of the turns of the support. However, in order to be able to provide filaments with such supports complicated apparatus is required.

In double coiled filaments the use of such supports causes a wide spread in the life of the lamps. When a slightly larger or slightly smaller part of the filament is short-circuited by a support, this gives rise to a much higher or much lower load of the filament and hence to a higher or lower operating temperature.

In addition, in double coiled filaments the pitch of the secondary turns is usually larger than the pitch of the turns of single coiled filaments so that the support has to be manufactured from considerably thicker and hence heavier wire to obtain a readily fixed support.

In lamps having a regenerative cycle, for example, tungsten-halogen cycle lamps, it is disadvantageous to have large quantities of metal (tungsten) at comparatively low temperature in the lamp. Said metal is transported to the filament and is deposited there in hot places. Dendrites may be formed which short-circuit turns of the filament and cause shortening of the life.

It is the object of the invention to provide lamps having a simple and stable construction of the double-coiled filament and the support.

According to the invention, in lamps of the kind mentioned in the preamble this object is achieved in that the filament comprises double coiled parts which are connected axially by a single coiled part, the inside diameter of the turns of which corresponds to the inside diameter of the secondary turns of the double coiled parts, the helically wound part of the wire support surrounding on the single coiled part of the filament.

Since a single coiled part has turns of single helically wound wire, the outside diameter of such a part is equal to the inside diameter (D) plus twice the wire thickness (d). The double coiled parts on the contrary consist of helically wound wire which is wound helically. The outside diameter of said parts thus is the inside diameter of the filament (D) plus twice the inside diameter ($D_p$) of the primary turns plus four times the thickness (d) of the wire used. The outside diameter of a single coiled part and of a double coiled part thus are in the proportion of $(D+2d):(D+2D_p+4d)$.

In lamps according to the invention, the larger outside dimension of the double coiled parts prevents, without additional measures, a support which surrounds a single coiled part from moving into engagement with a double coiled part and hence from short-circuiting a part which is destined for light emission and hence from overloading the filament. Consequently, the filament itself can thus be used to lock the support against axial movement.

Since the turns short-circuited by the support have relatively little mass and no extra thick wire is necessary for the support, the quantity of metal which is not made to glow when current passes through it is proportionately very small and the temperature thereof is proportionately high. Undesired transport of material in a regenerated cycle lamp is thus counteracted effectively.

The construction according to the invention can be realized in a simple and reproducible manner, which reduces the spread in the life of the lamps.

A single coiled part generally has at least two turns, preferably at least three. In practicing the gist of the invention it is of no significance whether a single coiled part of the filament has the same pitch as a double coiled part, or a pitch differing therefrom. However, from a point of view of ease of manufacture an equal pitch is to be preferred. The helically wound part of a support as a rule has a pitch differing from the single coiled part, preferably a smaller pitch.

It is to be noted that U.S. Pat. No. 3,286,116 discloses an incandescent lamp having a filament consisting of two double coiled parts which are connected by a single coiled part. The filament is supported on the single coiled part.

The filament and the support of this known lamp however, differ essentially from that of the lamp according to the invention. In fact, in the known lamp the single coiled part has a much smaller inside diameter than the double coiled part (the implications from a point of view of manufacture will be described hereinafter), while the support consists of two parallel wire pieces provided on either side of the filament and extending transversely to the axis of the filament and around which a third wire is wound. For this support to be effective, it is sealed and fixed in the wall of the lamp at both ends. Should this not be the case, the support would tilt (extend obliquely to the axis of the filament) as a result of which its supporting effect would be lost.

The known support is not only difficult to make an automatic machines, the support thus also requires a locking in the wall of the lamp envelope.

The manufacture of the construction according to the invention is considerably simpler than that of the known lamp.

Starting material in lamps according to the invention is a wire (for example tungsten) which is wound on a primary mandrel of, for example, molybdenum having a diameter $D_p$. After having made a previously chosen number of (primary) turns the winding wire is led longitudinally along the mandrel, after which again a number of (primary) turns are made on the mandrel. The resulting product is then wound around a thick secondary mandrel of diameter D. First, turns are made of the wire-wound primary mandrel, then turns of the primary mandrel along which wire extends in the longitudinal direction, and finally again turns of the wire-wound primary mandrel. A wire support is then wound around the central part of the resulting product. After etching away the two mandrels, the filament of a lamp according to the invention is obtained in which the wire support encloses the single coiled part with a negligible amount of play.

In a different manner, manufacturing the filament known from U.S. Pat. No. 3,286,116 involves winding a wire continuously on a primary mandrel of diameter $D_p$. While the primary mandrel is or is not present, the resulting wound wire has to be provided locally with the support and has to be wound helically on either side thereof so as to form the double coiled parts. Since the single coiled part of the filament is coaxial with the double coiled parts, a secondary mandrel cannot be used to form the double coiled parts unless the filament is deformed after removing the mandrels to obtain the ultimate geometry. It makes little difference whether the support is provided on the filament while the primary mandrel is still present or after it has already been removed. In both cases operations have to be performed on an object which mechanically is very weak (primary mandrels are very thin) and thus has little resistance to deformation.

Consequently, the manufacture of the filament disclosed in U.S. Pat. No. 3,286,116 is difficult and is difficult to automate.

The above and an embodiment of a lamp according to the invention will now be described in detail with reference to the drawing of which FIG. 1 shows diagrammatically a filament of a lamp according to the invention.

Figure 1:
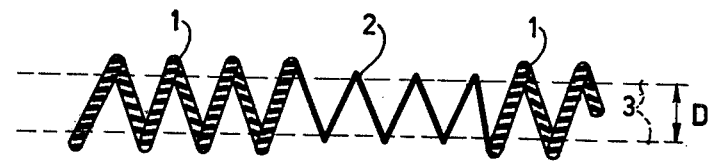
Figure 2:
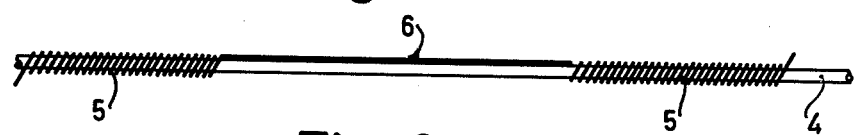
FIG. 2 shows an intermediate product in the production of the filament shown in FIG. 1.
Figure 3:
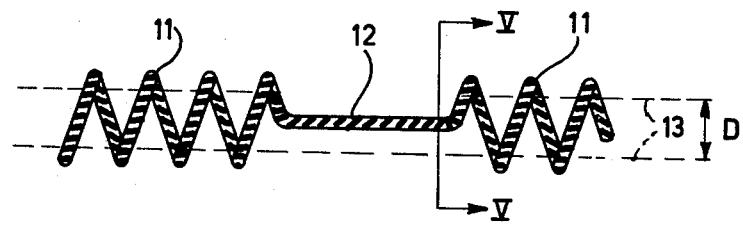
FIG. 3 shows diagrammatically a known filament.
Figure 4:
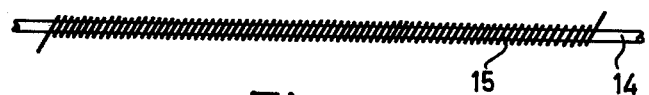
FIG. 4 shows an intermediate product in the production of the known filament shown in FIG. 3.
Figure 5:
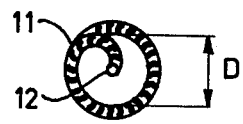
FIG. 5 is a cross-sectional view through the filament of FIG. 3

In FIG. 1, two double coiled parts or axial segments are each referenced by the numeral 1. They are connected by a single coiled part 2. The contour of the secondary mandrel which has already been etched away is denoted by broken lines 3. FIG. 2 shows a primary mandrel 4 on which first a number of filament turns 5 have been provided after which the wire 6 is led or extended along the mandrel 4 in the longitudinal axial direction of the latter and further turns 5 have been formed. After winding around mandrel 3 in FIG. 1 and etching away the mandrels (3 and 4), the parts 5 produce the parts 1 in FIG. 1, while part 6 of FIG. 2 produces part 2 of FIG. 1. In FIG. 3, reference numerals 11 denote the double coiled parts of the filament known from U.S. Pat. 3,286,116. 12 is the single coiled part. FIG. 4 shows the primary mandrel 14 on which filament wire 15 is wound from which the filament of FIG. 3 is manufactured, by winding the assembly of FIG. 4 around two pieces of a second mandrel 13 indicated in FIG. 3 and by etching away both mandrel 14 and mandrel 13. FIG. 5 illustrates that the double coiled parts 11 cannot be wound on a secondary mandrel of diameter D, unless a filament, after winding on a secondary mandrel and removing the mandrels, is deformed to obtain the configuration shown in FIG. 3.

In lamps according to the invention the support is provided on part 2 (FIG. 1), in lamps according to the United States Patent it is provided on part 12 (FIG. 3).

FIGS. 1 and 3 clearly demonstrate the essential differences between the filament according to the invention and the known filament. In FIG. 1 the single coiled part 2 has the same inside diameter D as the turns of the double coiled parts 1. In FIG. 3 the single coiled part 12 has the diameter $D_p$ of the primary mandrel 14 as inside diameter, while the double coiled parts 11 have an inside diameter D.

According to the above referred to United States Patent, a support is provided on part 12. For that purpose, the special support is used because a support wound around part 12 cannot be conveniently manufactured without damaging the filament.

In FIG. 1 on the contrary a support can easily be provided by a machine around part 2, while the mandrels 3 and 4 are still present to give the assembly great strength and resistance to deformation. When the mandrels are subsequently etched away, the support surrounds the filament concentrically in a manner which allows only negligible play. Good positioning of the filament in the lamp envelope is ensured.

Figure 6:
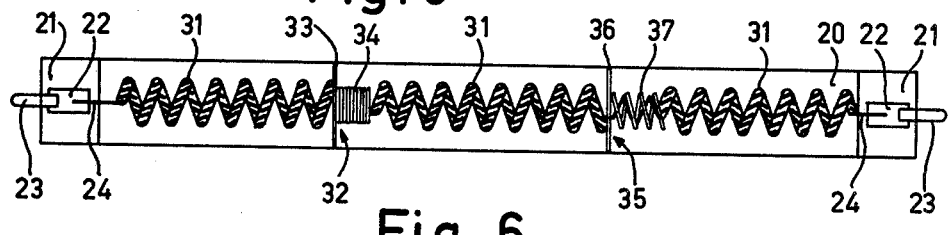
FIG. 6 shows an incandescent lamp according to the invention.

FIG. 6 shows a lamp having a tubular lamp envelope 20 which is sealed at its ends by pinch seals 21 in which a molybdenum foil 22 is incorporated to which an external current conductor 23 is welded at one end and an internal current conductor 24 is welded at the other end. A filament having double coiled parts 31 and supports 32 and 35 is arranged coaxially in the lamp envelope. The supports 32 and 35 are provided on single coiled parts 2 (not shown) which connect to one axial extremity of each of the double coil parts 31. The single coil part 2 cooperating with support 32 is obscured by the support 32. Support 32 has a spiral portion 33 axially ajacent to a helically wound portion or helix 34. The turns of which engage each other. The helically wound part 37 of support 35 has a larger pitch than the corresponding part of support 32 but a smaller pitch than the filament.

The lamps according to the invention may be constructed as infrared radiators, floodlight lamps and the like, with or without a regenerative gas filling.

EXAMPLE:

A quartz glass tubular lamp envelope having an inside diameter of 8 mm and a capacity of 3.5 cm$^3$ has a gas filling of 2.5 atm (argon 99.8% by volume, $CH_2BR_2$ 0.2% by volume). A filament formed from tungsten wire having a diameter of 120 $\mu$m is stretched axially in the lamp envelope. The filament has single coiled parts of an inside diameter of 625 $\mu$m and double coiled parts of the same inside diameter. The primary turns of the double coiled parts have an inside diameter of 184 $\mu$m.

The pitch of the single coiled (s.c.) parts and of the double coiled (d.c.) parts is 0.68 mm. The filament has in axial sequence first 8 d.c. turns, then 3.5 s.c., 20 d.c., 3.5 s.c., 20 d.c., 3.5 s.c., 20 d.c., 3.5 s.c., 8 d.c. turns. Supports of tungsten wire of 250 $\mu$m diameter are provided on the s.c. parts and consist of a helically wound part with 5 turns, pitch 250 $\mu$m, which changes into a part which spirals towards the wall. During operation at 225 V the lamp consumes a power of 500 W.

What is claimed is:

1. An electric lamp which comprises: a tubular lamp envelope having a ball, a filament of helically wound wire disposed in generally axially aligned relationship in said envelope, first and second current supply conductors extending through said wall of said lamp envelope in a vacuum-tight manner, said filament having in axial sequence a first double coiled axial segment, a first single coiled axial segment and a second double coiled axial segment, said first double coiled axial segment being connected to said single coiled axial segment which is connected to said second double coiled axial segment, the inside diameters of each of said segments being equal, said filament being supported between the ends thereof by at least one axially elongated wire support which has a spiral part at one end which is disposed with the periphery thereof in contact with the interior of said wall of said lamp envelope, said support including a helix at the other end thereof, said helix contacting said first single coiled segment.

2. An electric lamp as described in claim 1, wherein said first and second double coiled axial segments each having a large outside diameter than the inside diameter of said helix, said larger outside diameter of said first and second double coiled axial segments limiting axial movement of said filament.

3. An electric lamp as claimed in claim 1, wherein said single coiled axial segment has the same pitch as said first and second double coiled axial segments.

4. An electric lamp as claimed in claim 1, wherein said first single coiled axial segment has a larger pitch than said helix.

* * * * *